(12) United States Patent
Li et al.

(10) Patent No.: US 11,410,998 B2
(45) Date of Patent: Aug. 9, 2022

(54) LDMOS FINFET STRUCTURE WITH BURIED INSULATOR LAYER AND METHOD FOR FORMING SAME

(71) Applicant: GLOBALFOUNDRIES U.S. Inc., Santa Clara, CA (US)

(72) Inventors: Wenjun Li, Saratoga Springs, NY (US); Man Gu, Malta, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 122 days.

(21) Appl. No.: 16/796,326

(22) Filed: Feb. 20, 2020

(65) Prior Publication Data

US 2021/0265342 A1 Aug. 26, 2021

(51) Int. Cl.
*H01L 29/78* (2006.01)
*H01L 27/092* (2006.01)
*H01L 29/66* (2006.01)
*H01L 21/8238* (2006.01)

(52) U.S. Cl.
CPC .... *H01L 27/092* (2013.01); *H01L 21/823821* (2013.01); *H01L 29/66681* (2013.01); *H01L 29/7816* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 8,354,330 B2 | 1/2013 | Cheng et al. | |
| 8,466,012 B1 | 6/2013 | Chang et al. | |
| 8,674,440 B2 | 3/2014 | Korec et al. | |
| 8,847,310 B1 | 9/2014 | Korec | |
| 9,196,728 B2 | 11/2015 | Sridhar | |
| 9,472,615 B2 | 10/2016 | Zhang et al. | |
| 9,905,688 B2 | 2/2018 | Lee | |
| 2012/0058608 A1 | 3/2012 | Cheng et al. | |
| 2012/0241862 A1* | 9/2012 | Zhang | H01L 29/407 257/339 |
| 2016/0027684 A1* | 1/2016 | Chang | H01L 29/785 257/401 |
| 2016/0181358 A1* | 6/2016 | Zhang | H01L 29/6681 257/339 |
| 2017/0222042 A1 | 8/2017 | Lee | |
| 2018/0012966 A1* | 1/2018 | Ning | H01L 29/401 |
| 2018/0108755 A1 | 4/2018 | Liu et al. | |
| 2018/0122942 A1 | 5/2018 | Ponoth et al. | |
| 2019/0131390 A1* | 5/2019 | Huang | H01L 29/66659 |
| 2020/0111905 A1* | 4/2020 | Liu | H01L 29/407 |

* cited by examiner

*Primary Examiner* — Eric A. Ward
(74) *Attorney, Agent, or Firm* — Francois Pagette; Hoffman Warnick LLC

(57) ABSTRACT

Integrated circuit (IC) structures including buried insulator layer and methods for forming are provided. In a non-limiting example, a IC structure includes: a substrate; a first fin over the substrate; a source region and a drain region in the first fin; a first gate structure and a second gate structure over the first fin, the first and the second gate structures positioned between the source region and the drain region; and a buried insulator layer including a portion disposed under the first fin.

7 Claims, 16 Drawing Sheets

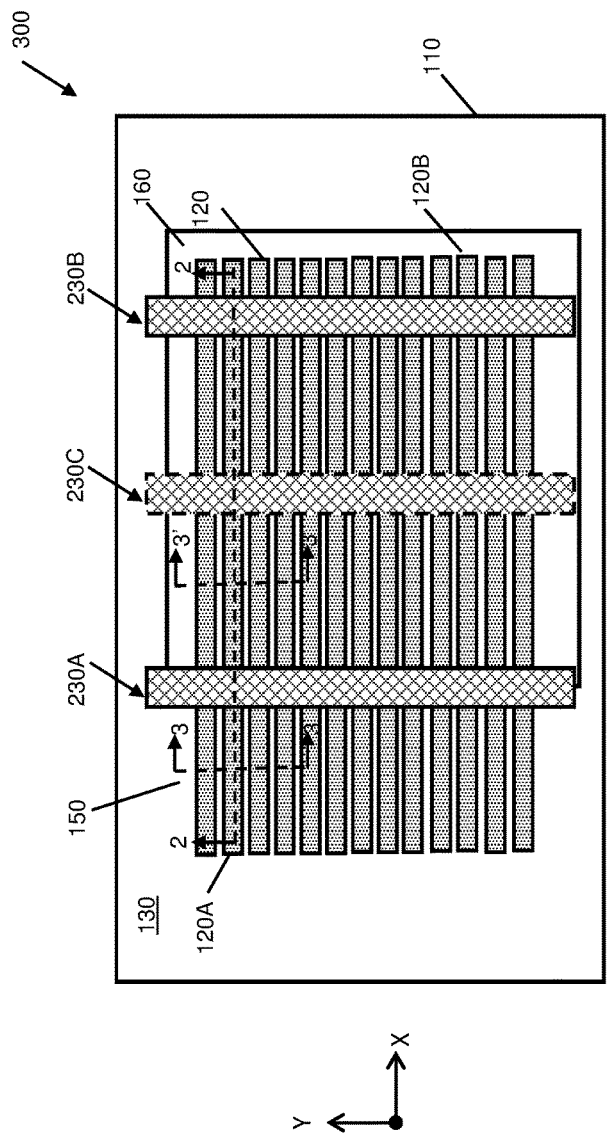
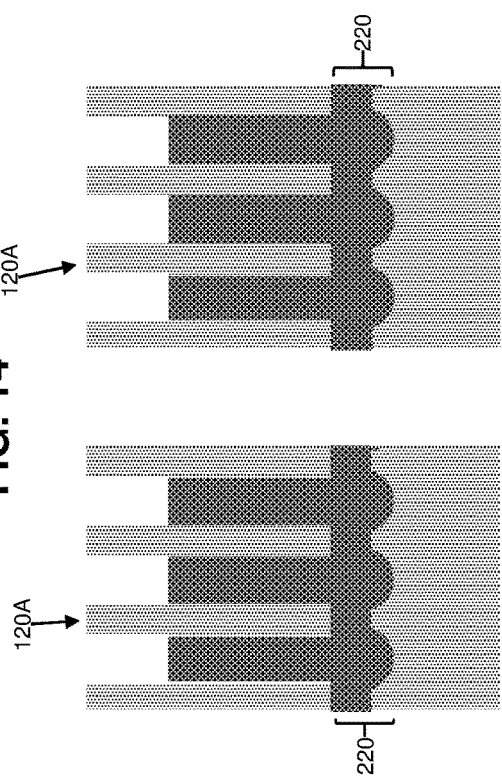
FIG. 14
FIG. 15A  FIG. 15B

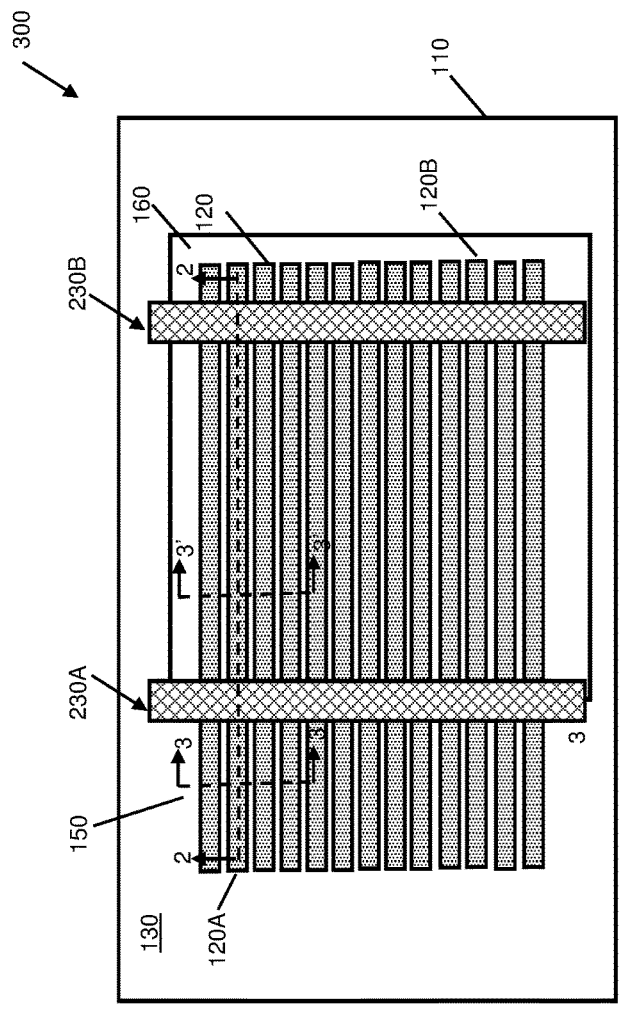
FIG. 17
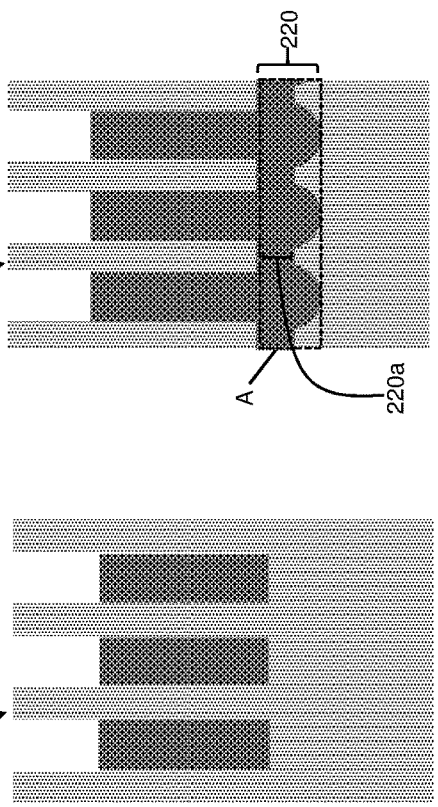
FIG. 18A
FIG. 18B

LDMOS FINFET STRUCTURE WITH BURIED INSULATOR LAYER AND METHOD FOR FORMING SAME

TECHNICAL FIELD

The present disclosure relates to methods of forming integrated circuit (IC) structures, and structures associated with the disclosed methods. More particularly, the present disclosure relates to laterally diffused metal-oxide-semiconductor fin-type field-effect transistor (LDMOS finFET) structures including a buried insulator layer and methods for forming the same.

BACKGROUND

Device structures for a field-effect transistor (FET) generally include a body region, a source region and a drain region defined in the body region, and a gate electrode configured to switch carrier flow in a channel formed during an operation in the body region. When a control voltage applied to the gate electrode exceeds a designated threshold voltage, carrier flow occurs in an inversion or depletion layer in the channel between the source and the drain regions to produce a device output current.

A fin-type field-effect transistor (finFET) is a non-planar device structure that may be more densely packed in an integrated circuit than planar field-effect transistors. A finFET may include a fin having a solid unitary fin body of semiconductor material(s), doped source/drain regions formed in sections of the body, and a gate electrode that wraps about a channel located in the fin body between the source and the drain regions. The arrangement between the gate structure and the fin body improves control over the channel and reduces a leakage current when the finFET is in its 'Off' state, in comparison with planar transistors. This, in turn, enables the use of smaller gate length than in planar transistors, and results in improved performance and lowered power consumption.

High-voltage integrated circuits used, for example, in microwave/RF power amplifiers typically require specialized circuit technologies capable of withstanding higher voltages. Laterally-diffused metal oxide semiconductor (LDMOS) devices are designed to handle higher voltages than logic field-effect transistors. For example, LDMOS finFET devices are mostly used in radio frequency (RF) power amplifiers and may provide a high breakdown voltage (e.g., between source and drain terminals). The high breakdown voltage may be achieved, for example, by a charge carrier (e.g., electron) flow path that passes through a depletion region.

However, in LDMOS finFET devices, a current path may exist around the bottom of the fins referred to as a "sub-fin" region, due to the depletion region next to a drain extension region of the LDMOS finFET devices. This may cause undesirable charge trapping in the sub-fin region, thereby increasing risks of LDMOS finFET devices failing to meet device reliability requirements, in particular hot-carrier injection (HCI). Conventional approaches to improve reliability of LDMOS finFET devices include, for example, well implant optimization, a super junction in drain extension region, use of a rotated substrate and shallow trench isolation (STI) liner oxide growth.

SUMMARY

A first aspect of the present disclosure provides an integrated circuit (IC) structure, including: a substrate; a first fin over the substrate; a source region and a drain region in the first fin; a first gate structure and a second gate structure over the first fin, the first and the second gate structures positioned between the source region and the drain region; and a buried insulator layer including a portion disposed under the first fin.

A second aspect of the present disclosure provides a method including: forming a first fin and a second fin on a substrate, each fin including a liner on sidewalls thereof; forming a mask over the second fin; etching to recess the substrate adjacent the first fin, exposing an upper portion of the substrate, where the upper portion of the substrate is disposed under the first fin; removing the mask; depositing an oxide material over the first and second fins; and annealing to thermally oxidize the upper portion of the substrate, creating a buried insulator layer that includes an oxidized upper portion of the substrate.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 14 shows the plan view along x-axis and y-axis of the IC structure of FIG. 13, according to embodiments of the disclosure.

FIG. 15A shows a cross-sectional view, along line 3-3 of the IC structure of FIG. 14, according to embodiments of the disclosure.

FIG. 15B shows a cross-sectional view, along line 3'-3' of the IC structure of FIG. 14, according to embodiments of the disclosure.

FIG. 17 shows a plan view along x-axis and y-axis of the alternative IC structure of FIG. 16, according to embodiments of the disclosure.

FIG. 18A shows a cross-sectional view, along line 3-3 of the IC structure of FIG. 17, according to embodiments of the disclosure.

FIG. 18B shows a cross-sectional view, along line 3'-3' of the IC structure of FIG. 17, according to embodiments of the disclosure.

Figure 1:
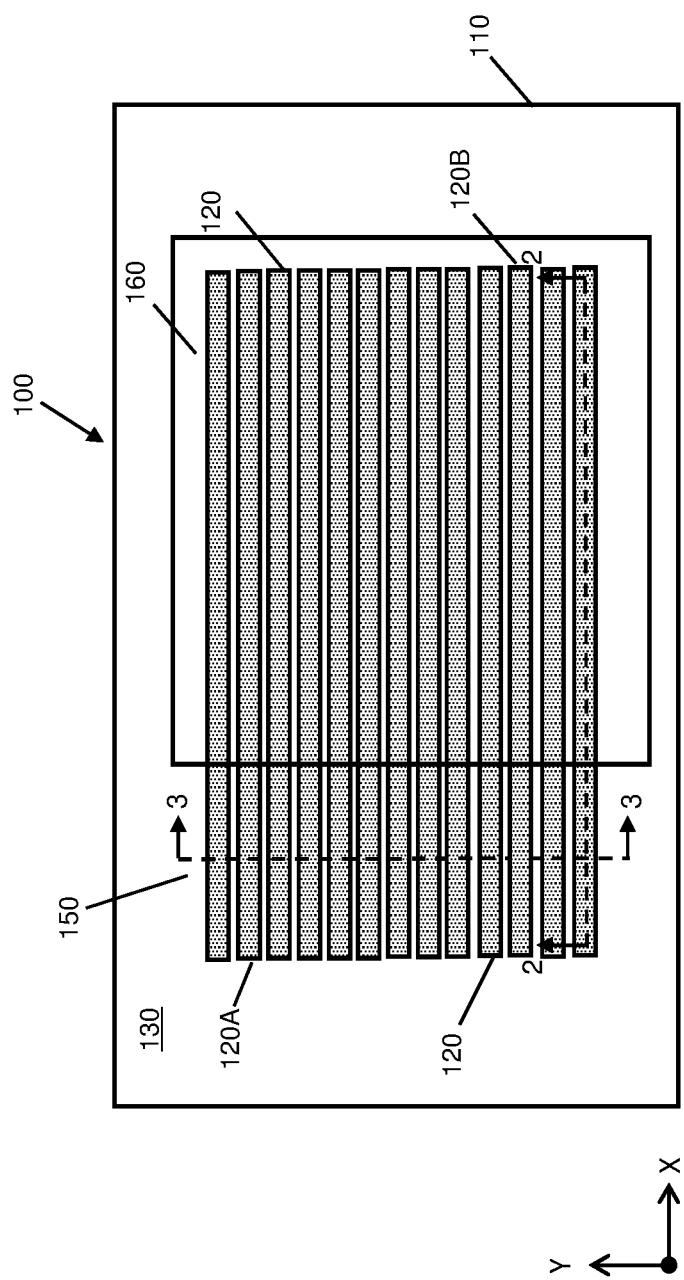
FIG. 1 shows a plan view of an initial structure to be processed, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

FIG. 1 provides a plan view of an initial structure 100 to be processed, according to embodiments of the disclosure. Structure 100 of FIG. 1 provides one preliminary set of materials targeted for use with embodiments of the disclosure, but it is to be understood that embodiments of the disclosure may be implemented on different designs without significant changes to the various techniques discussed herein. Structure 100 may include a set (i.e., one or more) of semiconductor regions from which transistor structures may be formed. Semiconductor regions can be formed in a variety of ways from a substrate 110. Various embodiments may include regions of semiconductor material in the form of semiconductor fins (simply "fin(s)" or "fin" hereafter) 120 extending in parallel with each other. Structure 100 may include a set (i.e., one or more) of fin(s) 120 extending in a first direction (e.g., a lateral direction along x axis or y axis). FIG. 1 provides a non-limiting example including a plurality of fins 120, but structure 100 may include any desired number of fins 120. Substrate 110 may extend beyond the box illustrated in FIG. 1, such that FIG. 1 illustrates a portion of substrate 110. In embodiments, fin dimensions (e.g., fin width, fin length) and fin spacing between fin(s) 120 need not be the same between any two adjacent or non-adjacent fin(s) 120. In some embodiments, fin(s) 120 may be cut to form fin(s) with shorter fin length(s).

A shallow trench isolation (STI) 130 (shown without cross-hatching in FIG. 1 solely for clarity) of structure 100 may be positioned underneath and/or adjacent to fin(s) 120. STI 130 may be formed of any currently-known or later developed materials for providing electrical insulation, and may include, but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermo-setting polyarylene ethers, a spin-on silicon-carbon containing polymer material, near frictionless carbon (NFC), or layers thereof.

A first well 150 and a second well 160 may be formed in substrate 110. As discussed in more detail later, first and second wells 150, 160 may be formed by applying dopants in corresponding regions in substrate 110 using any currently known or later developed techniques for applying dopants including, but not limited to, ion implantation.

Figure 2:
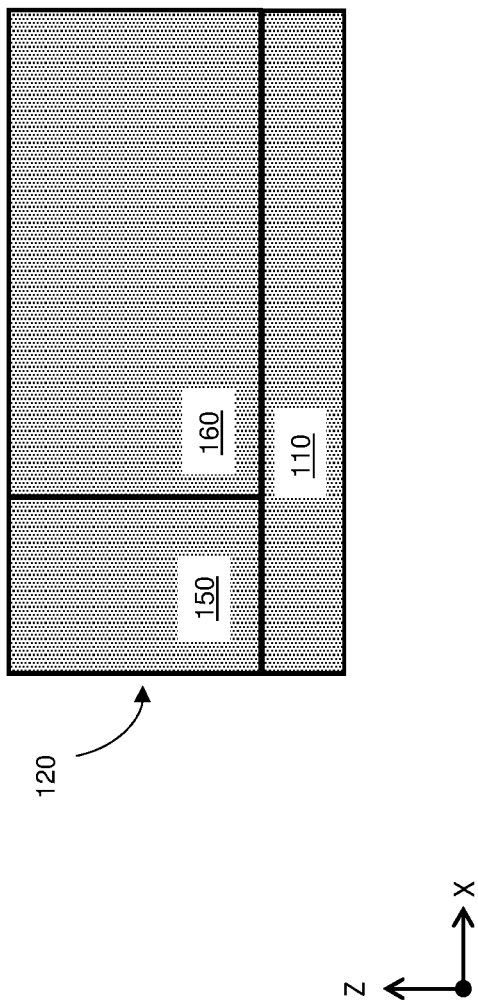
FIG. 2 shows a cross-sectional view, along line 2-2 of FIG. 1, of the initial structure, according to embodiments of the disclosure.

Referring to FIG. 2, fin(s) 120 and wells 150, 160 of structure 100 in FIG. 1 are shown in further detail. Substrate 110 may include, e.g., one or more currently known or later developed substances generally used in semiconductor manufacturing including, but not limited to, silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Each fin 120 may be formed from underlying substrate 110, e.g., by removing targeted portions of substrate 110 to a predetermined depth, causing the non-removed portions to form fin(s) 120 directly on substrate 110.

Methods of the disclosure may include forming first well 150 in substrate 110 by doping first well 150 with a first type of dopant; forming second well 160 in substrate 110 and laterally adjacent to first well 150 by doping second well 160 with a second type of dopant that is different from the first type of dopant. In certain embodiments, first and second wells 150, 160 may be formed by introducing or implementing a concentration of a respective dopant in substrate 110. Respective masks may be applied to define selected areas exposed for dopant implantations and may be removed after doping. Any now known or later developed techniques suitable for dopant implantation and/or mask removal may be used. In some embodiments, first well 150 may be doped with a p-type dopant including, but not limited to, p-type dopant selected from Group III of the Periodic Table (e.g., boron) effective to provide p-type conductivity. In embodiments, the second well 160 may be doped with an n-type dopant including, but not limited to, n-type dopant from Group V of the Periodic Table (e.g., phosphorus (P) and/or arsenic (As)) effective to provide n-type conductivity. In some embodiments, first and second wells 150, 160 may be an n-well and a p-well, respectively. Properties of first and second wells 150, 160 including, but not limited to, dopant types and/or doping concentrations may be tuned to meet certain specifications (e.g., threshold voltage $V_t$ requirements, etc.) for resulting IC structures.

Figure 3:
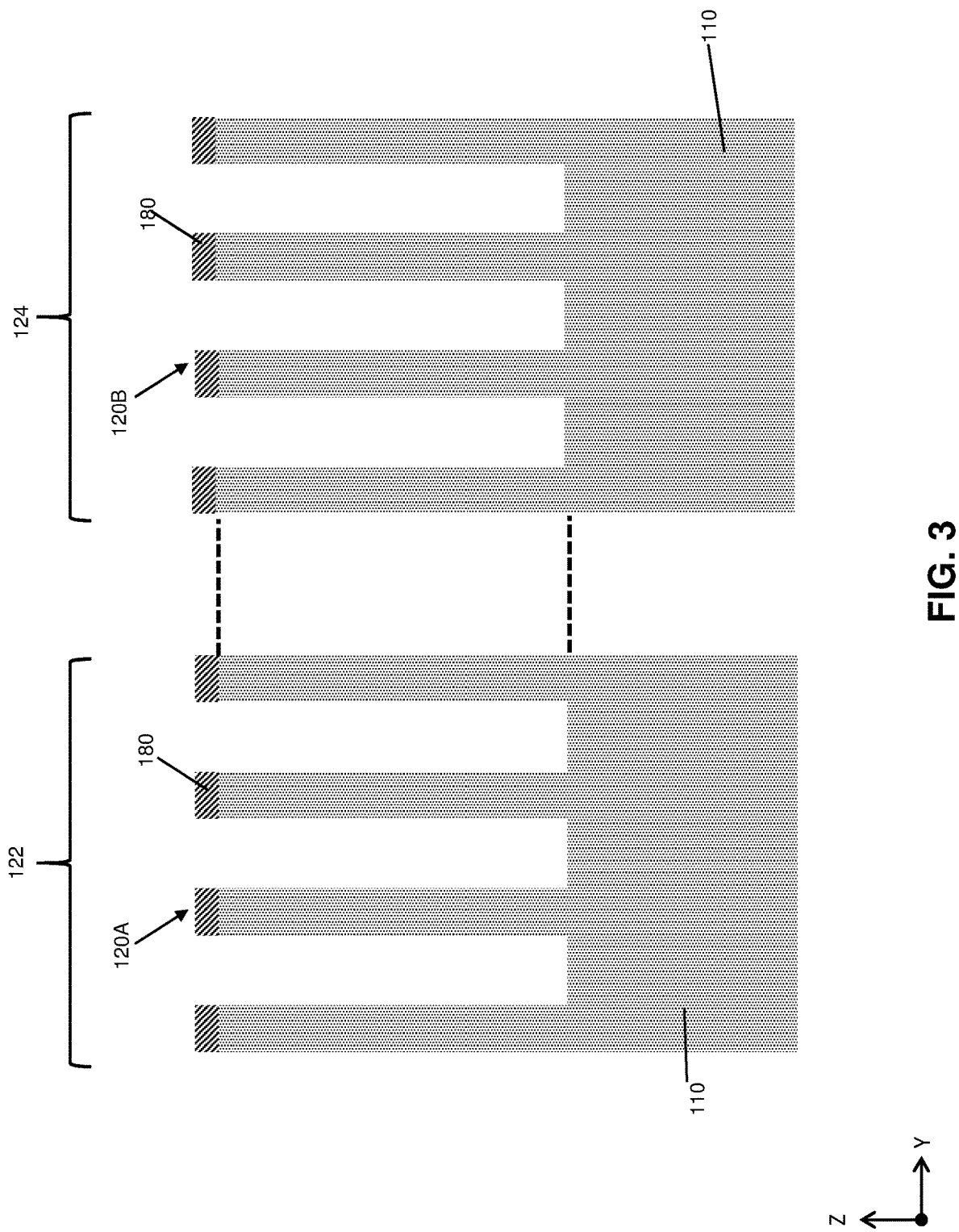
FIG. 3 shows a cross-sectional view, along line 3-3 of FIG. 1, of the initial structure, according to embodiments of the disclosure.

FIG. 3 shows a cross-sectional view, along line 3-3 of FIG. 1, of structure 100. In this non-limiting embodiment, a first set of fin(s) 120 including a first fin 120A and a second set of fin(s) 120 including a second fin 120B are formed on substrate 110. A first semiconductor region 122 that includes first fin 120A and one or more fin(s) 120 adjacent to first fin 120A, and a second semiconductor region 124 that includes second fin 120B and one or more fin(s) 120 adjacent to second fin 120B, are shown. It is to be understood that fins 120A and 120B may simply be referred to as fin(s) 120 as used herein and throughout the disclosure. To simplify, only eight fin(s) are shown in FIG. 3, with dotted lines between the first and second semiconductor regions 122, 124 representing spaces in which additional fin(s) might be present. It is to be understood that the arrangements of fin(s) in FIG. 3 and figures throughout the disclosure are merely non-limiting examples. As noted in conjunction with FIG. 1, structure 100 may include any desired number of fin(s) 120. In embodiments, one or more cap layers 180 may be formed over upper portions of fin(s) 120, serving as barrier layer(s) to protect portions of fin(s) 120 directly below cap layer(s) 180 during subsequent processing. In embodiments, one or more of cap layer(s) 180 may be silicon nitride.

Figure 4:
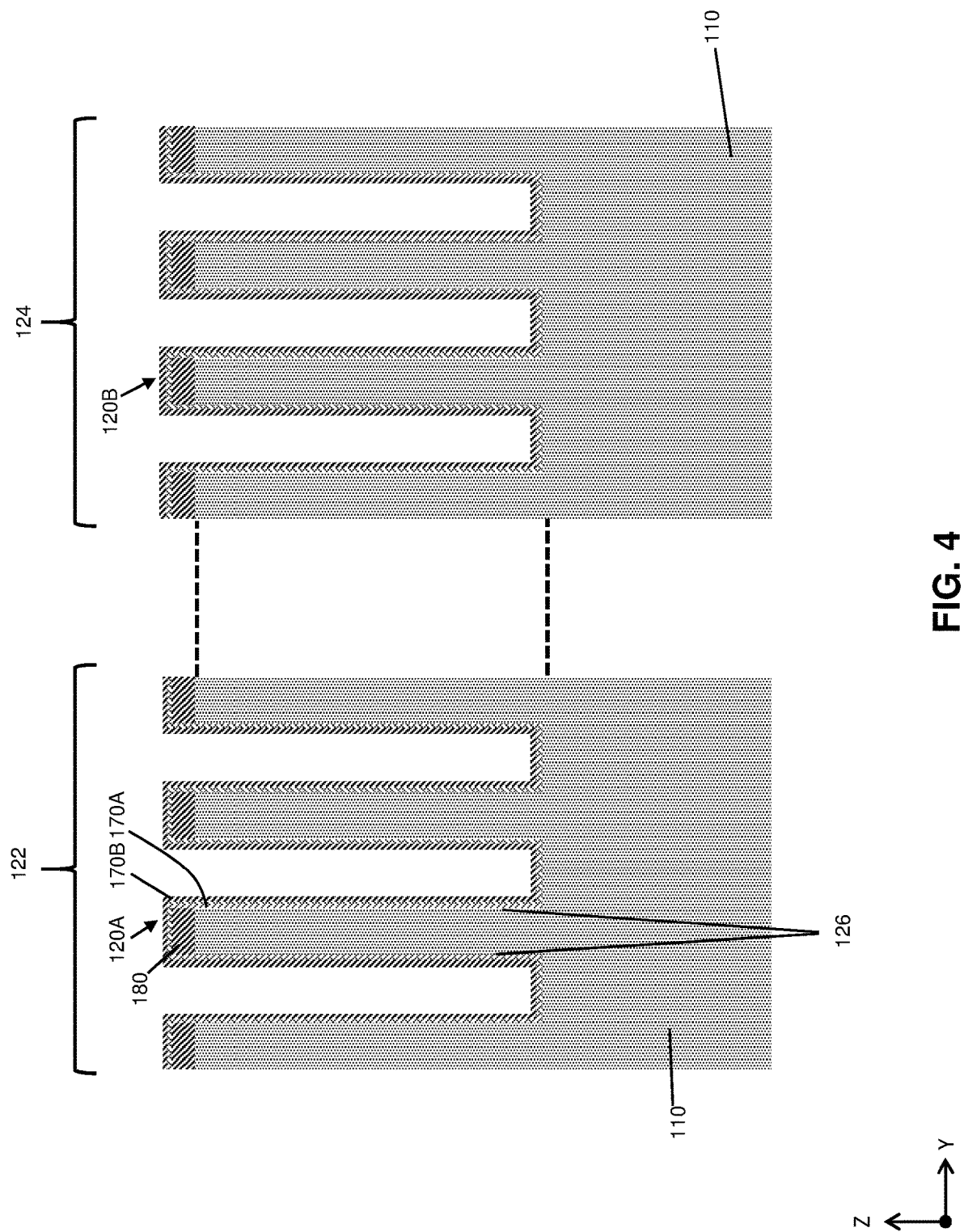
FIG. 4 shows a cross-sectional view of forming one or more liners, according to embodiments of the disclosure.

Referring to FIG. 4, each of the first and second sets of fin(s) 120 includes respective fin sidewall(s) 126. One or more liners 170 may be formed along sidewall(s) 126 of fin(s) 120. FIG. 4 provides a non-limiting example including two liners 170A, 170B, but embodiments of the disclosure may include any desired number of liner(s) 170. Liners 170A and/or 170B may simply be referred to as "liner 170" or "liner(s) 170" hereafter. Liner 170 may be provided as one or more layers of insulating material formed on portions of fin(s) 120, e.g., by deposition/etching, thermal growth, etc. Liner 170 may include one or more low-K dielectric materials, i.e., dielectric materials with a dielectric constant of at most approximately 3.9. Liner 170 may include one or more insulative oxide and/or nitride materials. In embodiments, liner 170 may be silicon nitride. In certain embodiments, liner 170 may include one or more insulative materials as the one(s) included in STI 130 or a different insulative material. In some embodiments, liner 170 may be formed as material(s) selected for ease of removal and replacement in subsequent processing.

Figure 5:
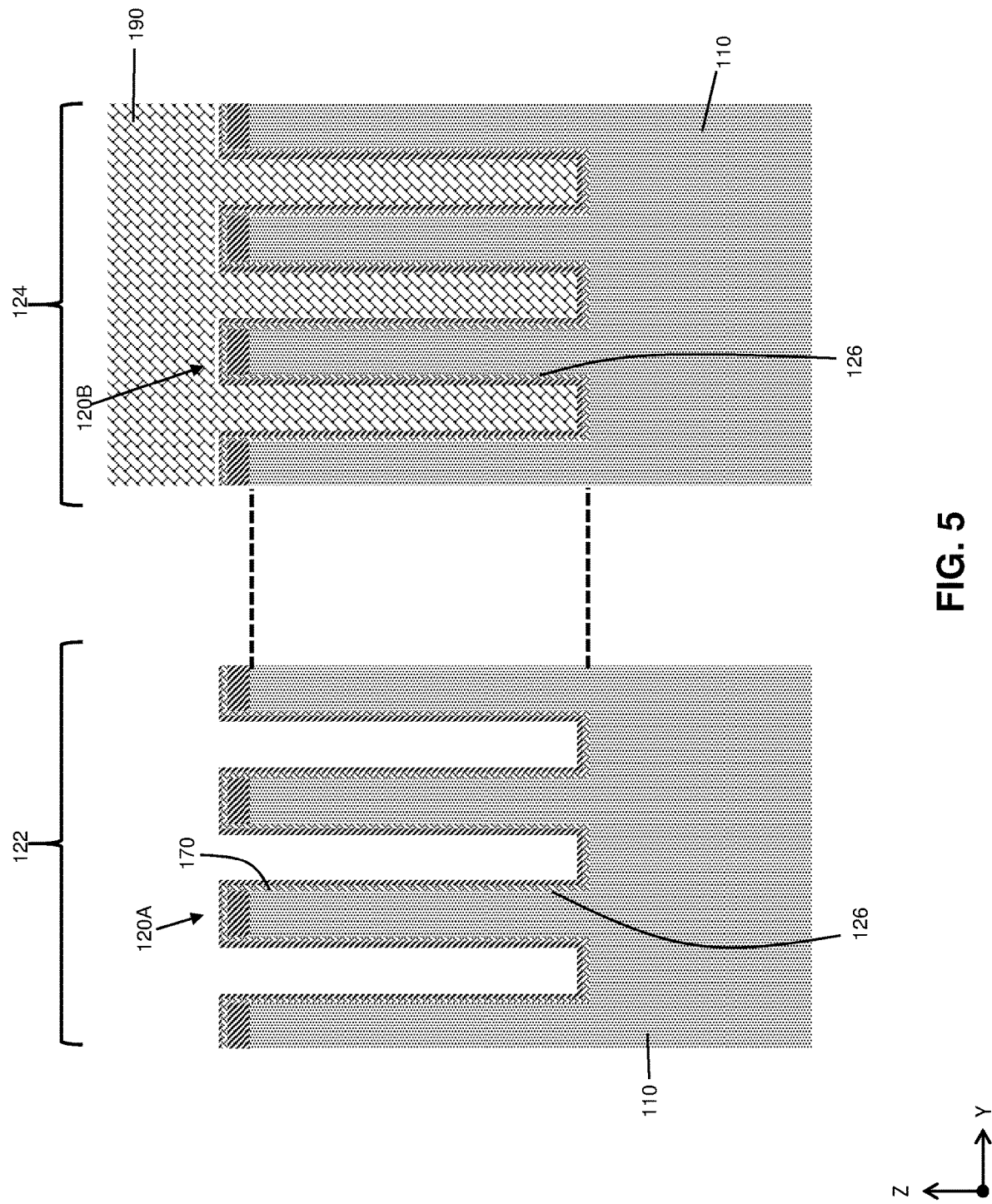
FIG. 5 shows a cross-sectional view of forming a mask, according to embodiments of the disclosure.

Proceeding to FIG. 5, a mask 190 may be formed over second fin 120B. Mask 190 may be formed to cover second semiconductor region 124, without covering first semiconductor region 122. In some embodiments, first fin 120A may eventually form a part of a LDMOS finFET structure. Mask 190 may include openings or otherwise may be structured not to cover first semiconductor region 122 on substrate 110. First semiconductor region 122 not covered by mask 190 remains susceptible to processing when mask 190 remains in place over second semiconductor region 124 on substrate 110. For example, locations not covered by mask 190 may be susceptible to processing by various etchants as discussed herein, while other materials beneath mask 190 will be protected. Mask 190 may be formed using any now known or later developed techniques, and may include any now known or later developed mask materials.

Figure 6:
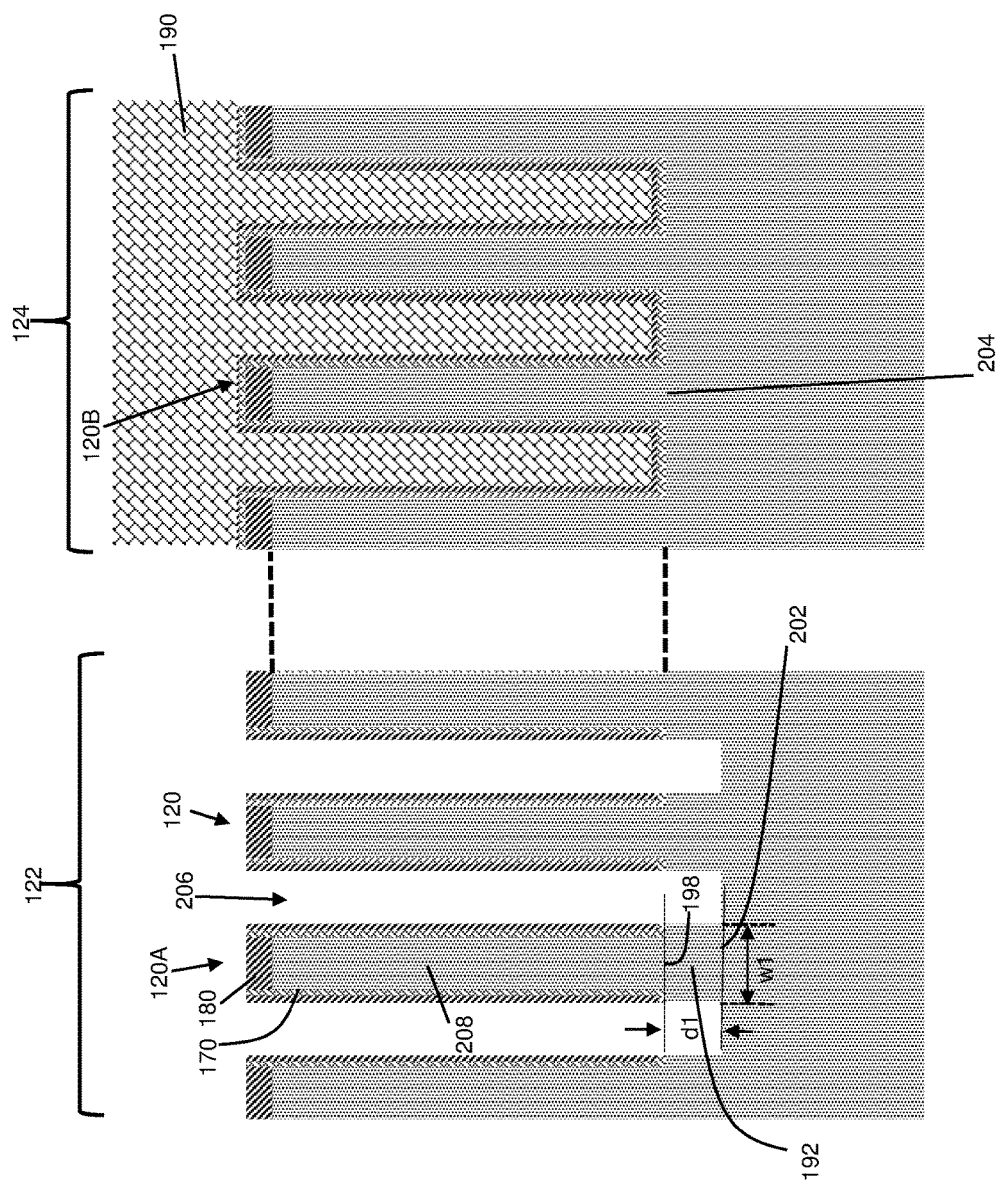
FIG. 6 shows a cross-sectional view of first etching including recessing a substrate, according to embodiments of the disclosure.
Figure 7:
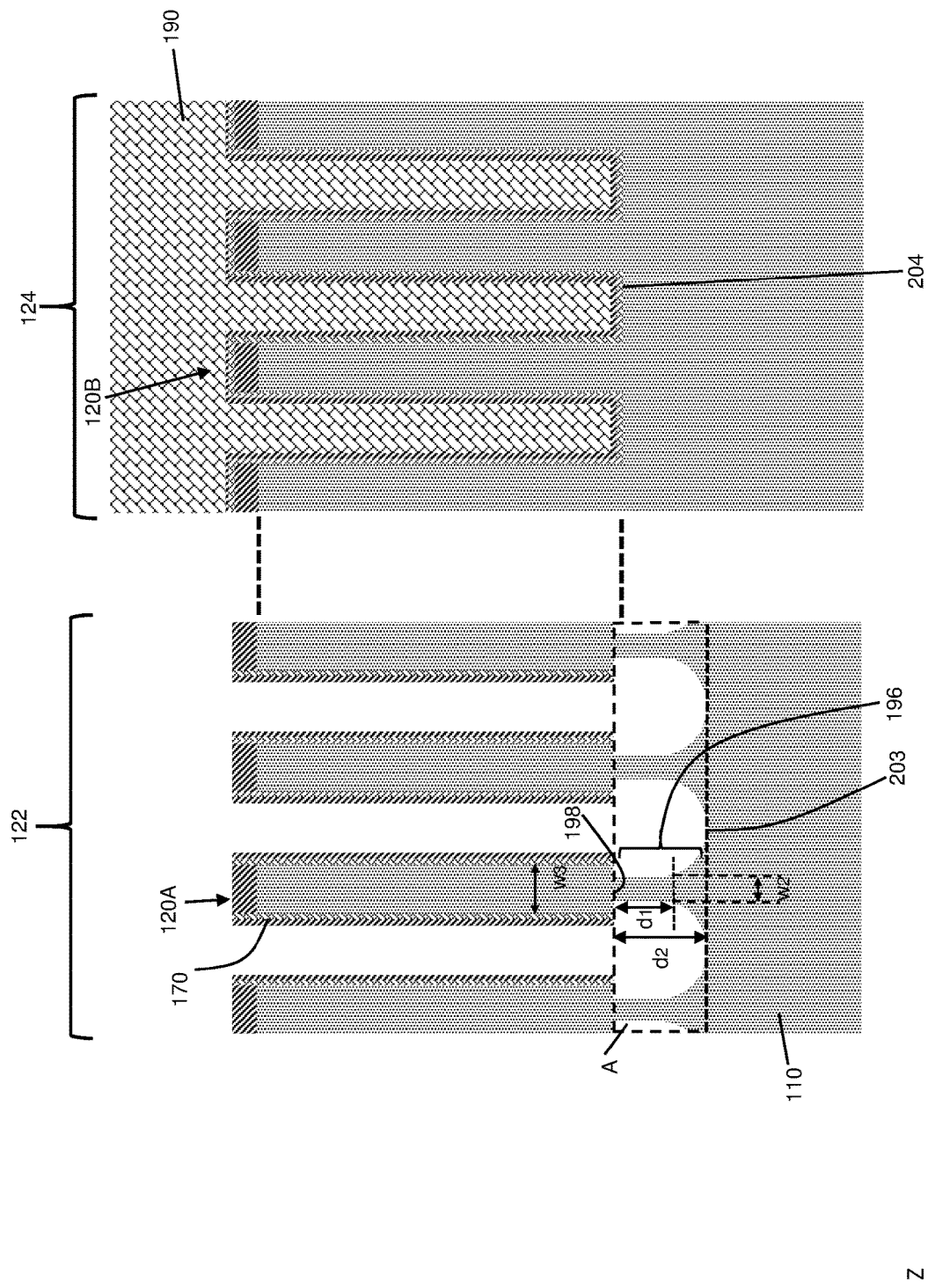
FIG. 7 shows a cross-sectional view of second etching including recessing a substrate, according to embodiments of the disclosure.

Referring to FIGS. 6 and 7, with mask 190 in place, further processing according to the disclosure may include etching portion(s) of substrate 110 including portion(s) under first fin 120A in first semiconductor region 122. Mask 190 prevents second semiconductor region 124 from being affected during the etching. Portions of first semiconductor region 122 not covered by mask 190 may be etched. As used herein and throughout the disclosure, "etching" generally refers to the removal of material from a substrate (or structures formed on the substrate), and is often performed with a mask in place so that material may selectively be removed from certain areas of the substrate, while leaving the material unaffected in other areas of the substrate. There are generally two categories of etching, (i) wet etch, and (ii) dry etch. Wet etch is performed with a solvent (such as an acid or a base) which may be chosen for its ability to selectively dissolve a given material (such as oxide), while leaving another material (such as polysilicon or nitride) relatively intact. This ability to selectively etch given materials is fundamental to many semiconductor fabrication processes. A wet etch will generally etch a homogeneous material (e.g., nitride) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. In the instant case, the etching may include, for example, a RIE.

Further referring to FIG. 6, in certain embodiments, etching includes etching to recess a portion of substrate 110 adjacent to first fin 120A, exposing an upper portion 192 of substrate 110. In some embodiments, etching to recess a portion of substrate 110 may include etching to recess a portion of substrate 110 adjacent to first fin 120A to a depth ($d_1$) below a lowermost extent 198 of first fin 120A, providing substrate 110 with radially protruding upper portion 192 having depth ($d_1$) and a width ($w_1$). As illustrated in FIG. 6, radially protruding upper portion 192 of substrate 110 may positioned directly below first fin 120A. Radially protruding upper portion 192 of substrate 110 may also be referred to as an outwardly protruding portion 192 of substrate 110. Protruding portion 192 may have a lowermost extent 202 that is below a lowermost extent 204 of second fin 120B in second semiconductor region 124. Parameters of recessed substrate 110, for example, depth ($d_1$) and width ($w_1$) of outwardly protruding portion 192 of substrate 110 may be controlled by controlling the etching process. Tuning or controlling parameters (e.g., $d_1$, $w_1$) for recessing substrate 110 helps define parameters of a buried insulator layer later formed in region 122. Details about the buried insulator layer will be discussed in more detail in conjunction with FIGS. 9-11.

With further reference to FIGS. 6 and 7, in certain embodiments, the etching may include a first etching and a second etching. The first etching and the second etching may be performed by any currently known or later developed techniques suitable for etching including, but not limited to, anisotropic etching and isotropic etching. In some embodiments, the first etching may include an anisotropic etching, and a second etching may include an isotropic etching. FIG. 6 illustrates a non-limiting example of a first etching. The first etching may be an anisotropic etching, in which an etching rate in a direction along the z-axis is much higher than an etching rate in a direction along the x-axis or the y-axis, thereby recessing substrate to a deeper depth along the z-axis, creating a deeper cavity 206 along the z-axis between first fin 120A and adjacent fin(s) 120 in first semiconductor region 122. FIG. 7 illustrates a non-limiting example of a second etching. The second etching may be an isotropic etching, in which neutral particles attack from all angles. The second etching further etches away sidewalls of outwardly protruding portion 192 of substrate 110 and upper portions of remaining substrate 110, thereby creating a portion 196 of substrate 110. In embodiments, portion 196 of substrate 110 positioned directly below first fin 120A may include a reduced width ($w_2$) than a width $w_3$ of first fin 120A. Portion 196 may include a depth ($d_2$) greater than depth ($d_1$) of portion 192 (FIG. 6). In embodiments, portion 196 may include a lowermost extent 203 that is below lowermost extent 202 of portion 192 (FIG. 6). In embodiments, portion 196 may include lowermost extent 203 that is below lowermost extent 204 of second fin 120B in second semiconductor region 124. In certain embodiments, the second etching is highly selective and only etches portions of substrate 110 and keeps liner 170 almost intact. The first etching and the second etching may be performed sequentially. In embodiments, the first etching and the second etching may be performed simultaneously. The etching process(es) according to the present disclosure therefore allow portions 196 of substrate 110 under fin(s) 120 to be exposed and left unprotected by liner 170. As discussed in more detail in FIGS. 9 and 11, exposed portions (e.g., portions included in region A) without protection by liner(s) (e.g., liner 170) may be more readily oxidized in subsequent processing including, but not limited to, annealing.

Figure 8:
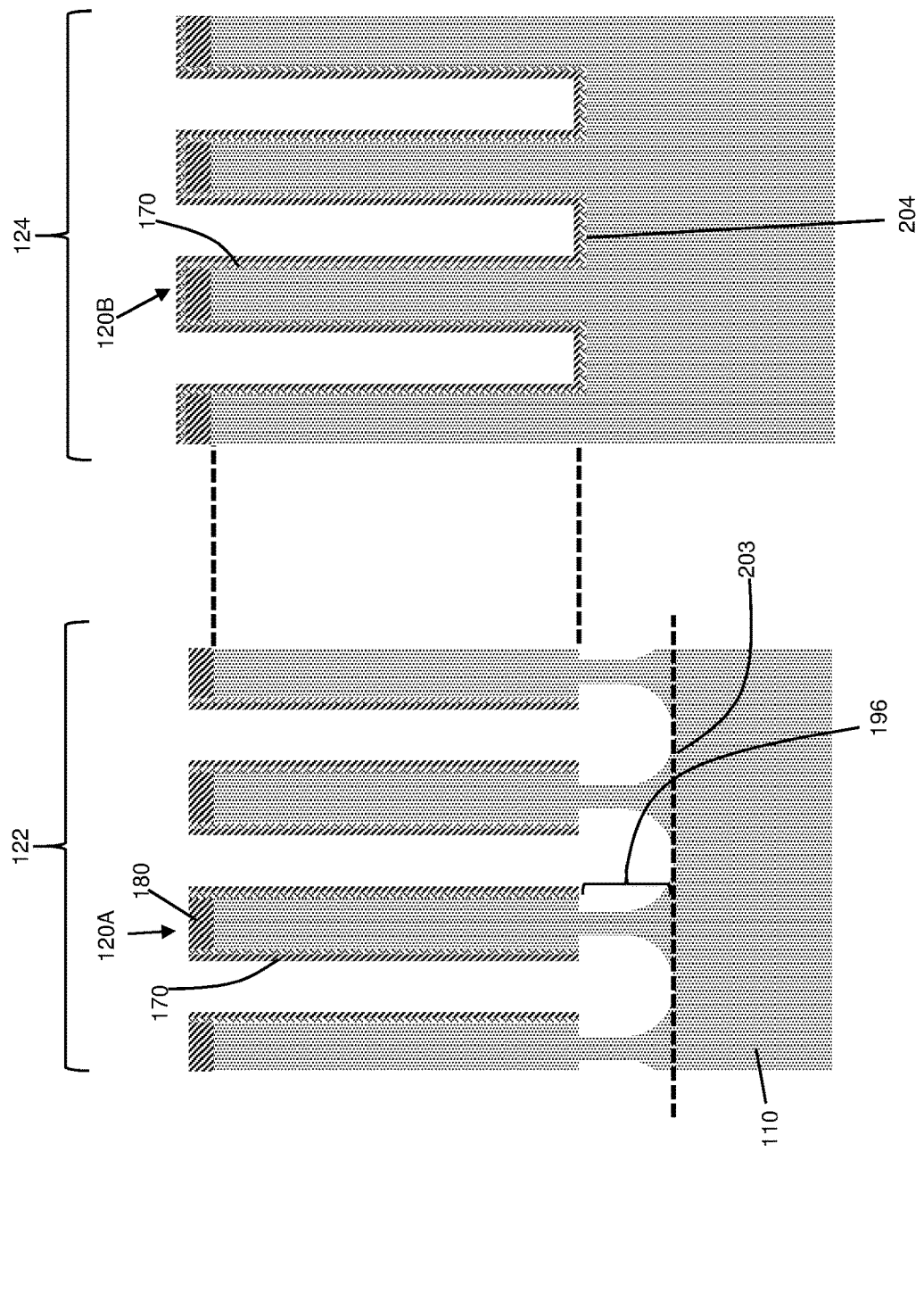
FIG. 8 shows a cross-sectional view of removing the mask, according to embodiments of the disclosure.

Proceeding to FIG. 8, mask 190 may be removed from second semiconductor region 124 by any currently known or later developed technique including, but not limited to, stripping, selective etch, and/or other techniques suitable for mask removal. In embodiments, one or more of liner(s) 170 may be optionally removed by any currently known or later developed technique including, but not limited to, stripping, selective etch, and/or other techniques suitable for liner removal.

Figure 9:
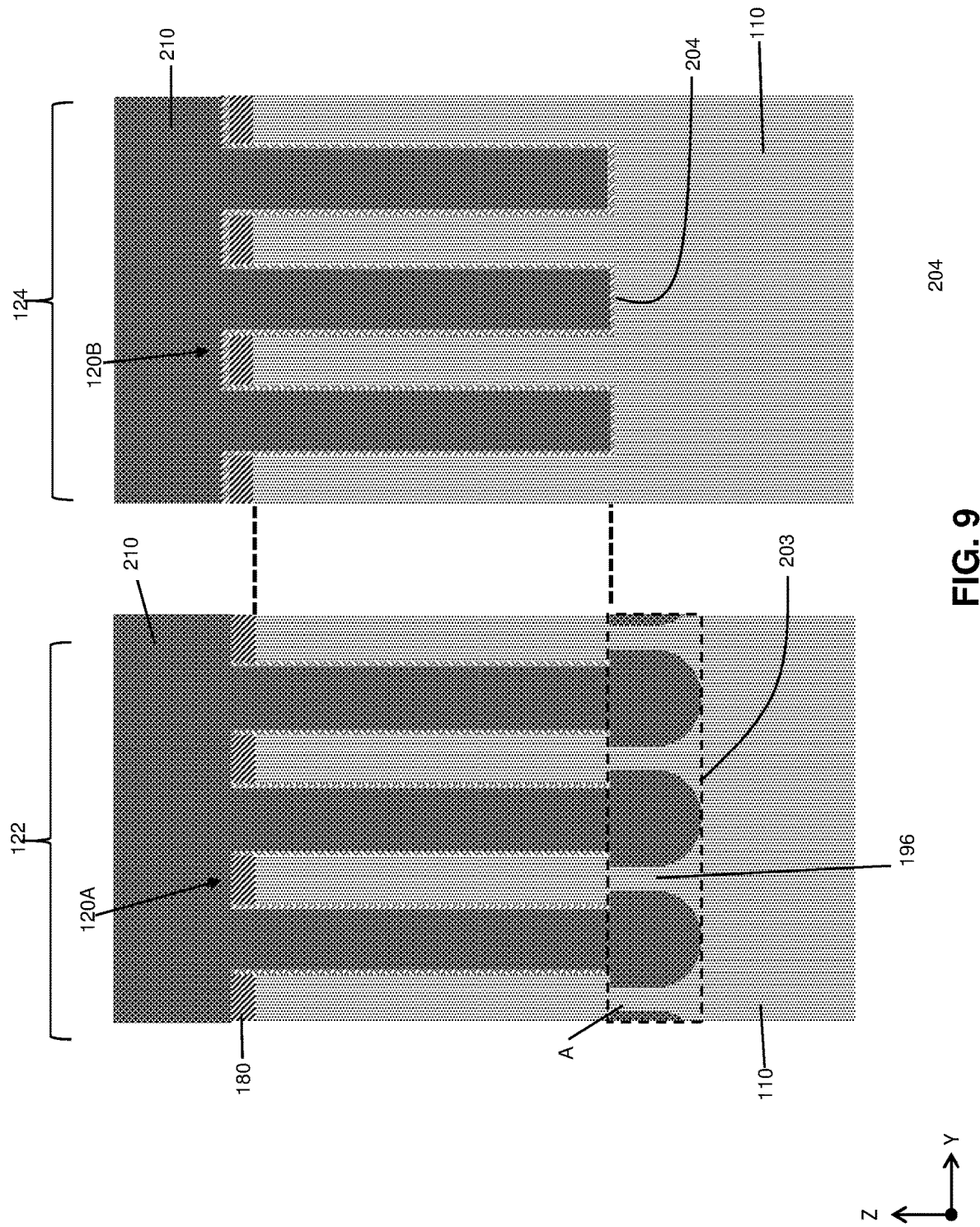
FIG. 9 shows a cross-sectional view of depositing an oxide material, according to embodiments of the disclosure.

Referring to FIG. 9, an oxide material 210 may be deposited over first and second semiconductor regions 122, 124. In embodiments, oxide material 210 may be silicon oxide ($SiO_2$). As described herein and used throughout the disclosure, "depositing" may include any now known or later developed techniques appropriate for the material to be deposited including, but not limited to, chemical vapor deposition (CVD), flowable chemical vapor deposition (FCVD), low-pressure CVD (LPCVD), plasma-enhanced CVD (PECVD), semi-atmosphere CVD (SACVD) and high density plasma CVD (HDPCVD), rapid thermal CVD (RT-CVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, or combinations thereof.

Figure 10:
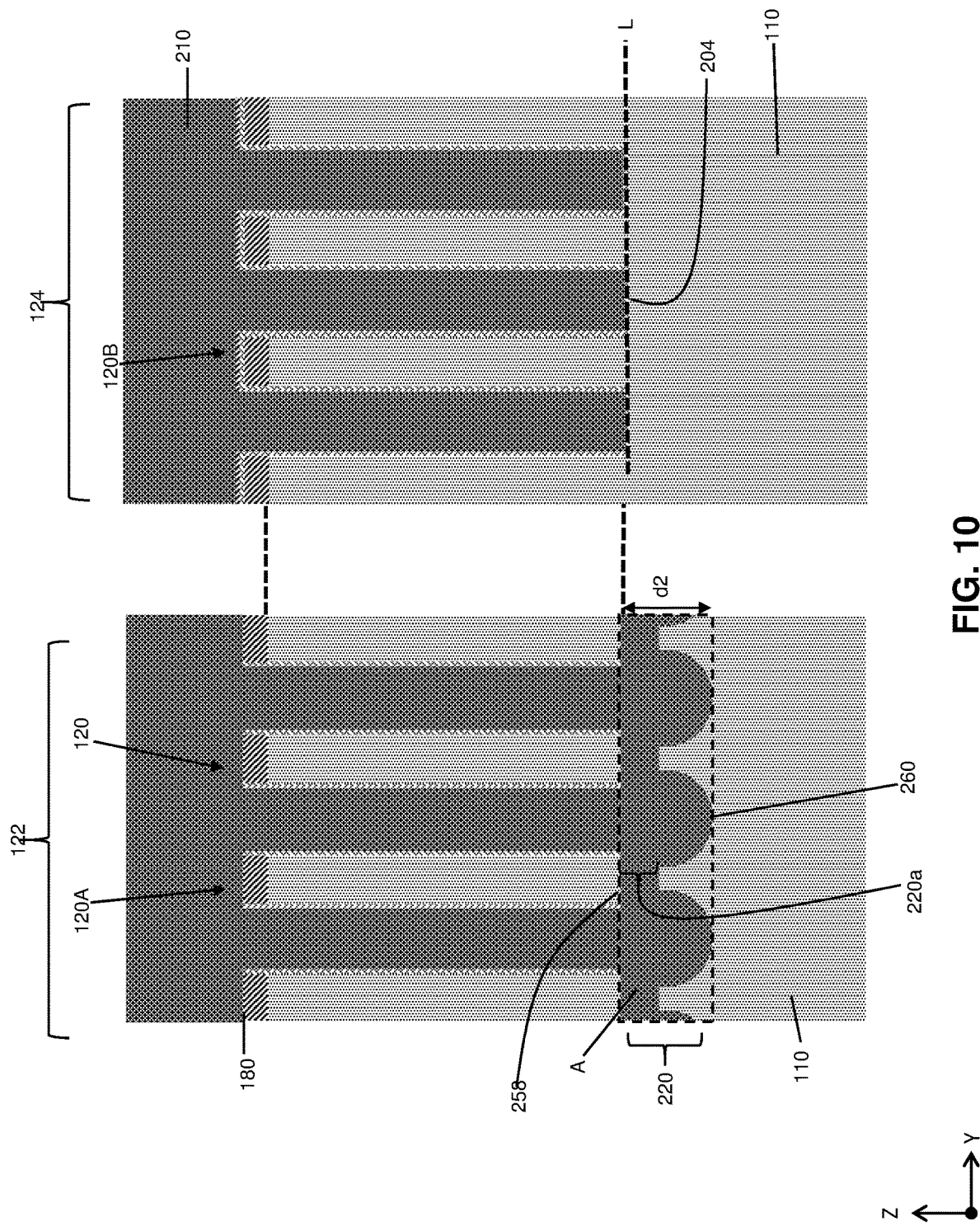
FIG. 10 shows a cross-sectional view of forming a buried insulator layer, according to embodiments of the disclosure.

Turning now to FIG. 10, first and second semiconductor regions 122, 124 may be subjected to subsequent processing. In certain embodiments, subsequent processing may include annealing. As described earlier in conjunction with FIG. 7, exposed portions (e.g. portions included in region A) not protected by liner(s) such as liner 170 may be more readily oxidized in processing such as annealing. Referring to FIGS. 9 and 10 together, in embodiments, methods of the disclosure may further include depositing oxide material 210 over first fin 120A and second fin 120B, and annealing to thermally oxidize portions of substrate 110 within region A, including portion 196, creating a buried insulator layer 220 including oxidized portion 196 of substrate 110. As illustrated in FIG. 10, buried insulator layer 220 may have a depth substantially the same as depth ($d_2$) of portion 196 (FIG. 7). In embodiments, buried insulator layer 220 may include a lowermost extent 260 that is below lowermost extent 204 of second fin 120B in second semiconductor region 124 (FIG. 7). Lowermost extent 260 may be aligned with lowermost extent 203 of portion 196 (FIGS. 7 and 9). It is to be understood that annealing may be an exothermic process and may lead to an uneven distribution of oxidized material throughout buried insulator layer 220. In certain embodiments, lowermost extent 260 of buried insulator layer 220 between adjacent fin(s) 120 may not be aligned or coplanar.

In some embodiments, buried insulator layer 220 may include the same material as oxide material 210. In embodiments, oxide material 210 may be silicon oxide ($SiO_2$), substrate 110 may be a silicon substrate, and annealing may convert exposed portions 196 of substrate 110 into silicon oxide ($SiO_2$), creating buried insulator layer 220 including silicon oxide ($SiO_2$). It is to be understood that buried insulator layer 220 including silicon oxide ($SiO_2$) is provided as a non-limiting example, and that process(es) and material(s) that may be implemented for providing buried insulator layer 220 of the present disclosure are not limited to the embodiment(s) described herein.

Figure 11:
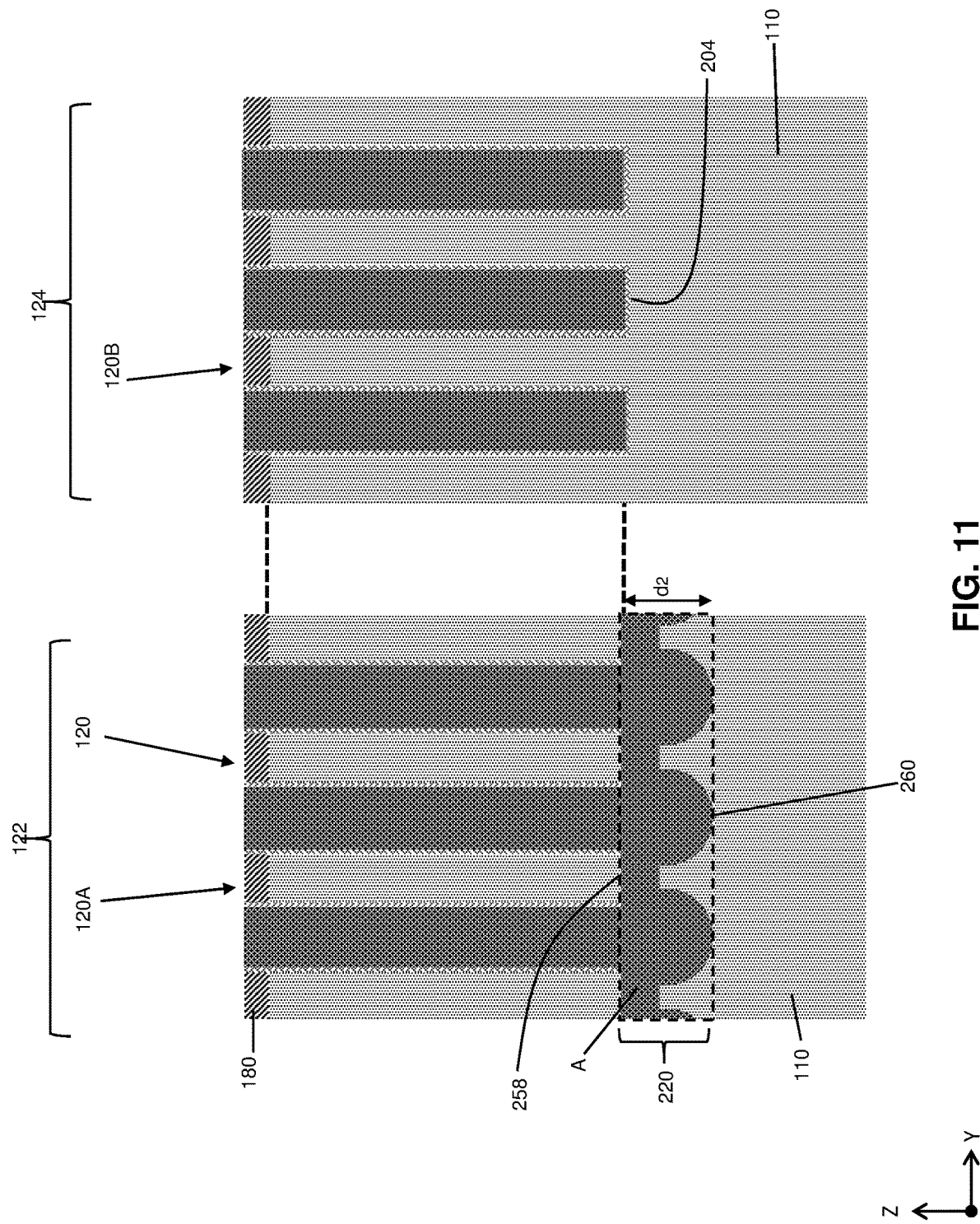
FIG. 11 shows a cross-sectional view of surface planarization, according to embodiments of the disclosure.

Referring to FIG. 11, in some embodiments, subsequent processing of first and second semiconductor regions 122, 124 may include removing excess oxide material 210 by surface planarization. Any currently known or later developed techniques suitable for surface planarization may be used, including, but not limited to, chemical-mechanical polishing for surface planarization.

Figure 12:
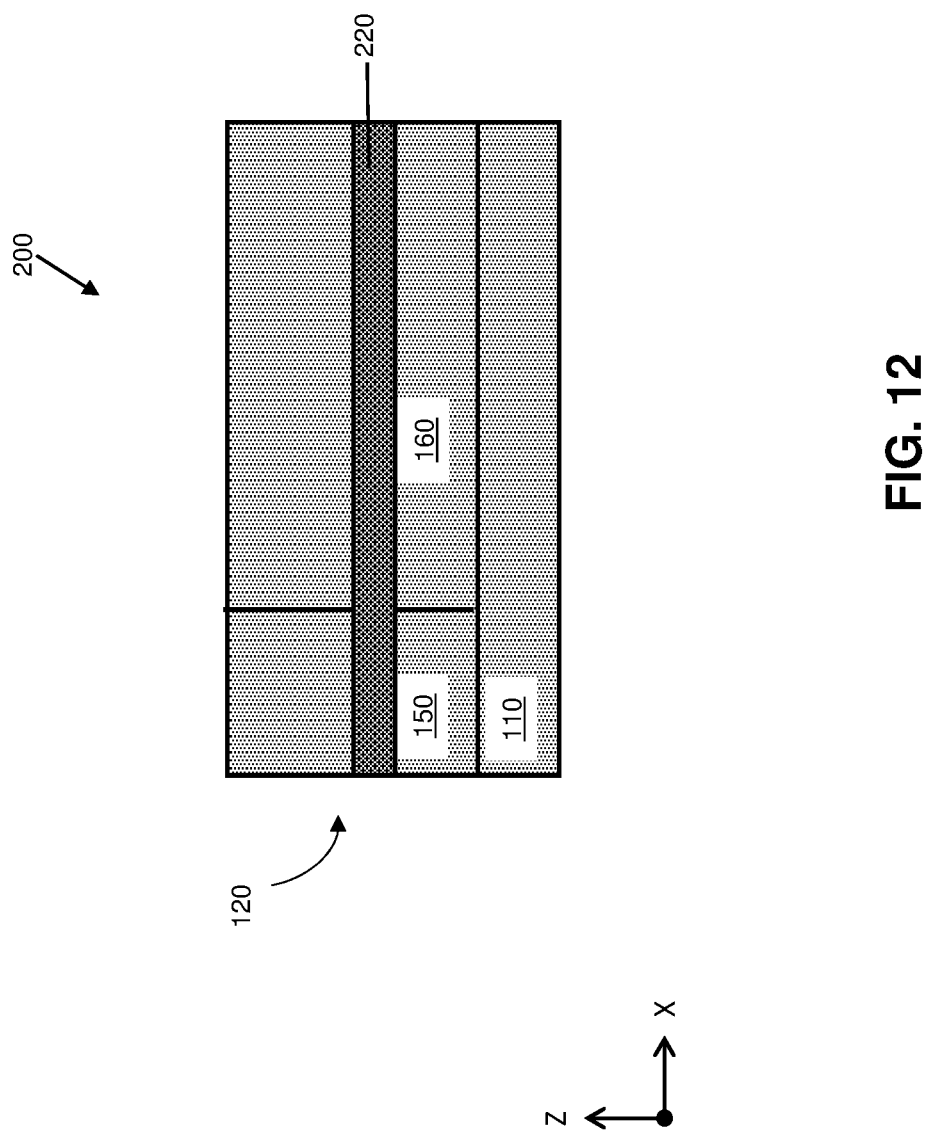
FIG. 12 shows a cross-sectional view of a structure with a buried insulator layer formed therein, according to embodiments of the disclosure.

FIG. 12 shows a cross-sectional view of structure 200 based on initial structure 100 of FIG. 2, now modified with newly formed buried insulator layer 220 between fin 120 and substrate 110. More detailed descriptions about buried insulator layer 220 are discussed later in the disclosure.

Figure 13:
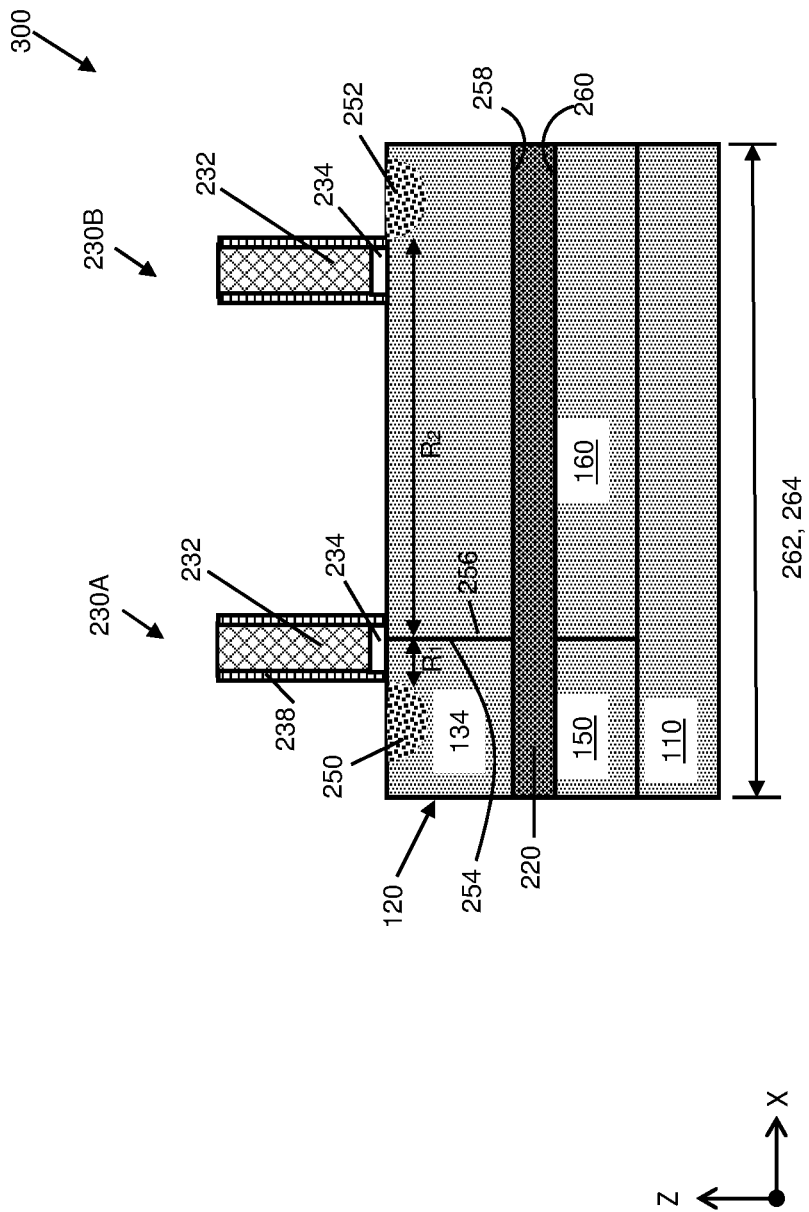
FIG. 13 shows a cross-sectional view along x-axis and z-axis of an IC structure, according to embodiments of the disclosure.

With reference to FIG. 13, and at a subsequent fabrication stage, a set (i.e., one or more) of gate structure(s) (or simply "gate(s)" or "gate" hereafter) 230 may be formed that extends over structure 200 (FIG. 12) to form an IC structure 300. Gate structure(s) 230 may extend transversely over fin(s) 120, with each gate structure 230 (e.g., 230A, 230B) having one or more regions positioned over corresponding fin(s) 120 in structure 200 (better seen in FIG. 14). Gate structure(s) 230 may cover one or more fins 120, e.g., by coating exposed sidewalls and an upper surface of fin(s) 120. In some embodiments, the set of gate structure(s) 230 may be disposed over first fin 120A, where at least one gate structure 230A of the set of gate structure(s) 230 is disposed partly over first well 150 and at least a different gate structure 230B of the set of gate structure(s) 230 is disposed solely over second well 160.

Gate structure(s) 230 may be formed by any now known or later developed technique suitable to form gate structures including, but not limited to, depositing a layer stack of different component materials and patterning the deposited layer stack with photolithography and etching. In certain embodiments, gate structure(s) 230 may be formed by using a replacement metal gate (RMG) processing paradigm. Each gate structure 230 may include a gate dielectric layer 234 over fin 120, and a gate region 232 over gate dielectric layer 234. Gate dielectric layer 234 may include, but not limited to, silicon dioxide ($SiO_2$), a high-k dielectric material such as hafnium oxide ($HfO_2$), or layered stacks of these and other dielectric materials. Gate region 232 may include a conductive component, such as metal, or a layered stack of metals. Each gate structure 230 may also include spacer(s) 238 formed adjacent to gate region 232 and/or gate dielectric layer 234. Spacer(s) 238 may be provided as one or more bodies of insulating material formed on exposed portions of STI 130 and/or gate structure(s) 230, e.g., by deposition/etching, thermal growth, etc. Spacer(s) 238 may be formed on or adjacent to gate structure(s) 230 to electrically and physically separate gate structure(s) 230 from other components of structure 300. Spacer(s) 238 may include one or more low-K dielectric materials, i.e., dielectric materials with a dielectric constant of at most approximately 3.9. Spacer(s) 238, for example, may include one or more insulative oxide and/or nitride materials. In some cases, spacer(s) 238 may include one or more insulative materials included in STI 130 or a different insulative material.

Referring to FIG. 13, methods of the disclosure may include forming a source region 250 and a drain region 252. In certain embodiments, source and drain regions 250, 252 may be formed in first fin 120A. Source and drain regions 250, 252 may have the same conductivity type. In embodiments, source region 250 may be formed in first fin 120A over a portion of first well 150, and include a first doped semiconductor material having an opposite conductivity type from first well 150. Drain region 252 may be formed in first fin 120A over a portion of second well 160, and include a second doped semiconductor material having the same conductivity type as second well 160. Methods for forming source and drain regions 250, 252 may include, but not limited to, etching fins 120 to form respective first and second etched volumes of fins 120 and epitaxially growing respective doped semiconductor materials in the etched volumes of fins 120, and/or ion implantation. In embodiments in which first well 150 is p-type and second well 160 is n-type, the semiconductor materials constituting source and drain regions 250, 252 may both be doped with an n-type dopant to provide n-type conductivity.

As illustrated in FIG. 13, in some embodiments, a channel region $R_1$ may exist below first gate structure 230A and extend between source region 250 and an innermost edge 254 of first well 150. A drain extension region $R_2$ may exist below first and second gate structures 230A, 230B and extend between drain region 252 and an innermost edge 256 of second well 160 directly adjacent or overlap with innermost edge 254 of first well 150. In embodiments, source region 250 and channel region $R_1$ are disposed above first well 150, and drain extension region $R_2$ and drain region 252 are disposed above second well 160. In embodiments, gate structure 230A may be formed above channel region $R_1$ and laterally extends over and above at least a portion of drain extension region $R_2$. In embodiments, gate structure 230B may be formed solely above drain extension region $R_2$.

With further reference to FIG. 13 and referring back to FIGS. 6-12, a non-limiting embodiment of IC structure 300 formed according to methods of the present disclosure is illustrated. The embodiment of IC structure 300 may include, but not limited to: substrate 110; first fin 120A over substrate 110; source region 250 and drain region 252 in first fin 120A; first gate structure 230A and second gate structure 230B over first fin 120A, where first gate structure 230A and second gate structure 230B are positioned between source region 250 and drain region 252. IC structure 300 may include buried insulator layer 220 which further includes a portion 220a (FIG. 10) disposed under first fin 120A. As discussed earlier in conjunction with FIGS. 6 and 7, in the methods of the disclosure, etching may recess a portion of substrate 110 to a depth ($d_2$) below a lowermost extent 198 of first fin 120A, providing a region A (FIG. 7) that is exposed and without being protected by liner 170. Since portions of substrate 110 without protection by liner(s) may be more readily oxidized during subsequent processing such as annealing, buried insulator layer 220 may be formed in region A (referring back to FIGS. 7 and 10). As illustrated in more detail in FIG. 10, buried insulator layer 220 formed in region A may result from annealing of portion 196 (FIG. 7) of substrate 110. Buried insulator layer 220 may therefore be referred to as including a portion 220a (FIG. 10) disposed under fin(s) 120. Portion 220a disposed under fin(s) 120 may also be referred to as a "sub-fin" portion. An imaginary line "L" is drawn in FIG. 10, which extends along a lowermost extent of fin(s) 120, e.g., lowermost extent 204 of second fin 120B adjacent buried insulator layer 220, to further illustrate that buried insulator layer 220 is formed and includes a "sub-fin" portion 220a. Buried insulator layer 220 may have a depth $d_2$ that is substantially the same as depth $d_2$ of region A of FIG. 7. One will appreciate that parameters (e.g., dimensions) of buried insulator layer 220 may therefore be tuned or controlled by controlling etching process(es) in forming region A (FIG. 7). This "sub-fin" configuration of buried insulator layer 220 may contribute to enhanced device reliability by suppressing a current flow path in sub-fin areas, thereby minimizing undesirable charge trapping in the sub-fin region and hot-carrier injection (HCI).

Referring to FIG. 13, in embodiments, IC structure 300 may further include first well 150 in substrate 110, first well 150 including a first type of dopant; and second well 160 in substrate 110 and adjacent to first well 150, second well 160 including a second type of dopant that is different from the first type of dopant. In embodiments, IC structure 300 may further include channel region $R_1$ adjacent to source region 250, and drain extension region $R_2$ adjacent to channel region $R_1$ and laterally disposed between channel region $R_1$ and drain region 252, where source region 250 and channel region $R_1$ are disposed above first well 150, and drain extension region $R_2$ and drain region 252 are disposed above second well 160.

In embodiments, IC structure 300 may include two or more gate structures 230 disposed over first fin 120A, where at least one gate structure (e.g., 230A) is disposed over first well and second well 160 and at least one different gate structure (e.g., 230B) is disposed solely over second well 160. In certain embodiments, gate structure 230A may be disposed above channel region $R_1$ and at least a portion of drain extension region $R_2$, and where gate structure 230B may be disposed solely above drain extension region $R_2$. It is to be understood that while two gate structures 230A and 230B are illustrated in FIG. 13, additional gate(s) may optionally be formed between source and drain regions 250, 252. For example, a third gate 230C (as illustrated in phantom in FIG. 14) may be placed between source and drain regions 250, 252. In embodiments, third gate structure 230C may be positioned over first fin 120A and second fin 120B.

In some embodiments, as shown in FIG. 13, buried insulator layer 220 may be disposed above first and second wells 150, 160 and below source and drain regions 250, 252. As illustrated in detail in FIG. 13 and with reference to FIG. 10, buried insulator layer 220 includes uppermost extent 258 (FIG. 10) adjacent to portions of source region 250 and drain region 252, and opposite, lowermost extent 260 (FIG. 10) adjacent to portions of first and second wells 150, 160. In embodiments, uppermost extent 258 of buried insulator layer 220 is adjacent to channel region $R_1$, and drain extension region $R_2$. In embodiments, IC structure 300 may include second fin 120B over substrate 110 and adjacent to first fin 120A, where buried insulator layer 220 includes lowermost extent 260 below lowermost extent 204 (FIG. 10) of second fin 120B.

In embodiments, as illustrated in FIG. 13, first fin 120A has a fin length 262, and uppermost extent 258 of buried insulator layer 220 has a lateral length 264 that is substantially the same as fin length 262.

FIG. 14 shows another cross-sectional view along y-axis and z-axis of IC structure 300 (FIG. 13). In certain embodiments, IC structure 300 may include first fin 120A and second fin 120B over substrate 110, where first and second gate structures 230A, 230B are disposed over first fin 120A and second fin 120B. FIG. 14 provides a non-limiting example including a certain number of fins 120, but structure 300 may include any desired number of fins 120. As discussed earlier, structure 300 may further optionally include one or more additional gate(s) 230C, which is shown in phantom in FIG. 14.

As illustrated in FIG. 13, in embodiments, uppermost extent 258 of buried insulator layer 220 has a lateral length 264 that is substantially the same as fin length 262. That is, buried insulator layer 220 may extend laterally across the whole fin length 262. FIG. 15A shows a cross-sectional view, along line 3-3 of the IC structure 300 of FIG. 14. FIG. 15B shows a cross-sectional view, along line 3'-3' of the IC structure of FIG. 14. For reference, FIG. 13 shows a cross-sectional view, along line 2-2 of the IC structure 300 of FIG. 14 (with optional phantom gate structure 230C omitted for clarity). In embodiments where buried insulator layer 220 extends laterally along the full fin length 262, the cross-sectional views of FIGS. 15A and 15B both reveal buried insulator layer 220 including portion disposed under fin(s) 120.

Figure 16:
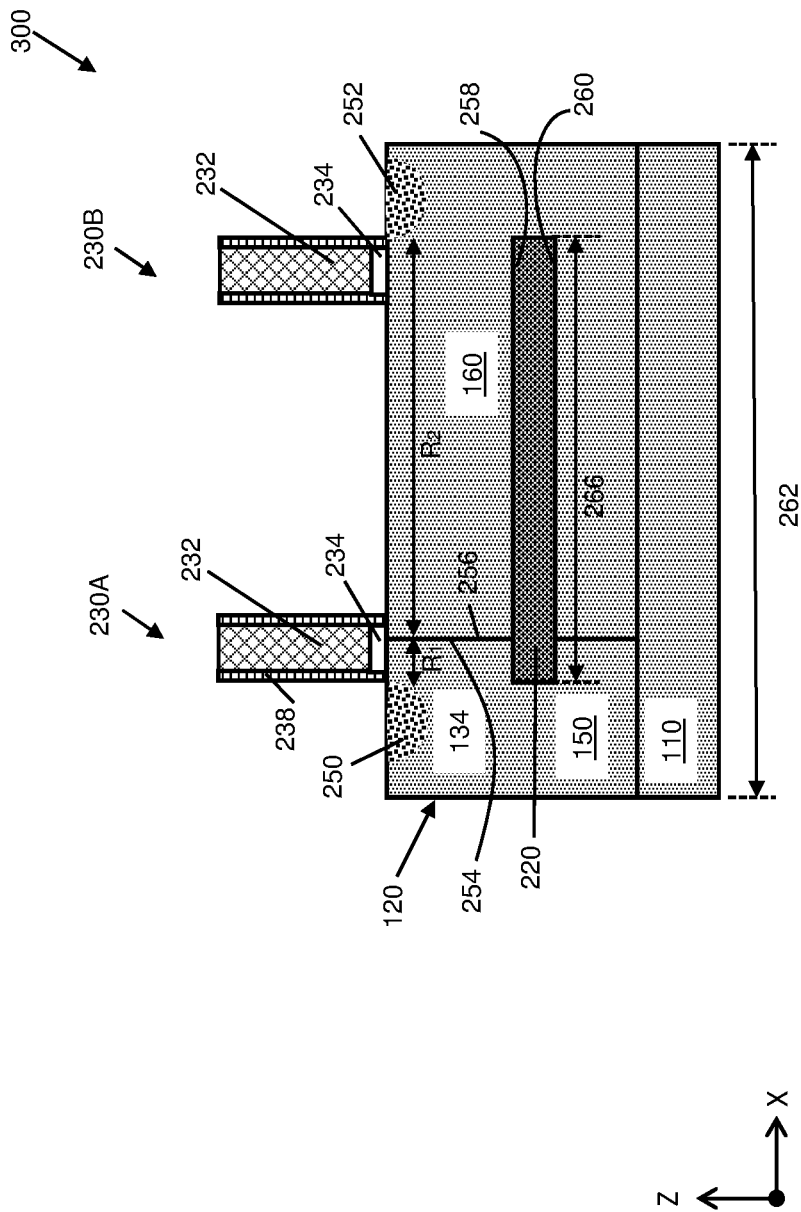
FIG. 16 shows a cross-sectional view along x-axis and z-axis of an alternative IC structure, according to embodiments of the disclosure.

FIG. 16 shows an alternative embodiment where uppermost extent 258 of buried insulator layer 220 has a lateral length 266 that is smaller than fin length 262. That is, buried insulator layer 220 only extends laterally along partial portions of fin length 262 below the channel region $R_1$ and drain extension region $R_2$. FIG. 17 shows another cross-sectional view along y-axis and z-axis of IC structure 300 (FIG. 16). FIG. 18A shows a cross-sectional view, along line 3-3 of the IC structure 300 of FIG. 17. FIG. 18B shows a cross-sectional view, along line 3'-3' of the IC structure of FIG. 17. In embodiments where buried insulator layer 220 partially extends along fin length 262, FIG. 18A reveals a region without buried insulator layer 220, and FIG. 18B shows a region A with buried insulator layer 220 including portion 220a disposed under fin 120A.

The embodiments of the present disclosure provide IC structure that includes, but not limited to, a first gate structure and a second gate structure over a first fin and positioned between a source region and a drain region, and a buried insulator layer includes a portion disposed under the first fin. The unique configuration of the buried insulator layer in the sub-fin region provides various benefits including, but not limited to, suppressing sub-fin conduction and HCI, and achieving higher Vmax, thereby increasing the device performance, e.g., in meeting reliability requirements. The processes and methods are also compatible with use of one or more replacement dummy gate processes, enabling versatile design options for efficient device fabrication and enhanced device performance.

It is noted that various modifications and variations of IC structure 300, while not being explicitly elaborated here for brevity, will be apparent to those of ordinary skill in the art without departing from the scope and spirit of the disclosure, and are intended to be part of this disclosure.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof "Optional" or "optionally" means that the subsequently described event or circumstance may or may not occur, and that the description includes instances where the event occurs and instances where it does not.

Where an element or layer is referred to as being "on," "engaged to," "connected to" or "coupled to" another element or layer, it may be directly on, engaged, connected or coupled to the other element or layer, or intervening elements or layers may be present. In contrast, when an element is referred to as being "directly on," "directly engaged to," "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items. "Optional" or "optionally" means that the subsequently described event or circumstance may or may not occur, and that the description includes instances where the event occurs and instances where it does not.

In addition, several descriptive terms may be used regularly herein, as described below. The terms "first", "second", and "third" may be used interchangeably to distinguish one component from another and are not intended to signify location or importance of the individual components.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
    a substrate;
    a first fin over the substrate;
    a source region and a drain region in the first fin;
    a first gate structure and a second gate structure over the first fin, the first and the second gate structures positioned between the source region and the drain region;
    a buried insulator layer including a portion disposed under the first fin;
    a first well in the substrate and including a first type of dopant;
    a second well in the substrate and laterally adjacent to the first well, the second well including a second type of dopant that is different from the first type of dopant;
    a channel region adjacent to the source region; and
    a drain extension region adjacent to the channel region and laterally disposed between the channel region and the drain region,
    wherein the source region and the channel region are disposed above the first well,
    wherein the drain extension region and the drain region are disposed above the second well, and
    wherein the buried insulator layer is beneath the channel region and the drain extension region, and wherein the first fin has a fin length, and the buried insulator layer has a lateral length that is smaller than the fin length of the first fin.

2. The IC structure of claim 1, further comprising:
    a second fin over the substrate, wherein the first gate structure and the second gate structure are disposed over the first fin and the second fin.

3. The IC structure of claim 1, further comprising a second fin over the substrate and adjacent to the first fin, wherein the buried insulator layer includes a lowermost extent that is below a lowermost extent of the second fin.

4. The IC structure of claim 1, wherein the buried insulator layer is disposed above the first well and the second well and below the source region and the drain region.

5. The IC structure of claim 1, further including a set of gate structures disposed over the first fin, wherein at least one of the set of gate structures is disposed over the first well and at least a different one of the set of gate structures is disposed over the second well.

6. The IC structure of claim 1, wherein the first gate structure is disposed above at least a portion of the channel region and at least a portion of the drain extension region, and wherein the second gate structure is disposed solely above the drain extension region.

7. The IC structure of claim 1, wherein the buried insulator layer has an uppermost extent adjacent to portions of the channel region and the drain extension region, and an opposite, lowermost extent adjacent to portions of the first well and the second well.

* * * * *